United States Patent
Drumm et al.

(10) Patent No.: US 10,108,763 B2
(45) Date of Patent: Oct. 23, 2018

(54) METHOD AND SIMULATION ARRANGEMENT FOR SIMULATING AN AUTOMATED INDUSTRIAL PLANT

(71) Applicant: Siemens Aktiengesellschaft, Munich (DE)

(72) Inventors: Oliver Drumm, Eggenstein-Leopoldshafen (DE); Benjamin Lutz, Pfinztal (DE); Christoph Pfleger, Karlsruhe (DE)

(73) Assignee: Siemens Aktiengesellschaft, Munich (DE)

( * ) Notice: Subject to any disclaimer, the term of this patent is extended or adjusted under 35 U.S.C. 154(b) by 447 days.

(21) Appl. No.: 14/600,725

(22) Filed: Jan. 20, 2015

(65) Prior Publication Data

US 2015/0205893 A1   Jul. 23, 2015

(30) Foreign Application Priority Data

Jan. 21, 2014   (EP) ..................................... 14151926

(51) Int. Cl.
  *G06F 7/60* (2006.01)
  *G06F 17/10* (2006.01)
  (Continued)

(52) U.S. Cl.
  CPC ... *G06F 17/5009* (2013.01); *G05B 19/41885* (2013.01); *G06F 17/10* (2013.01); *Y02P 90/26* (2015.11)

(58) Field of Classification Search
  CPC ...... G06F 17/5009; G06F 17/50; G06F 17/10; G05B 19/41885; Y02P 90/26
  (Continued)

(56) References Cited

U.S. PATENT DOCUMENTS

| | | | |
|---|---|---|---|
| 2007/0050070 A1* | 3/2007 | Strain | G06Q 10/06 700/99 |
| 2009/0089029 A1* | 4/2009 | Sturrock | G06F 17/5009 703/7 |
| 2011/0295578 A1* | 12/2011 | Aldrich | G06F 8/10 703/6 |

FOREIGN PATENT DOCUMENTS

| | | |
|---|---|---|
| DE | 102011055657 A1 | 5/2013 |
| WO | WO 2011023204 A1 | 3/2011 |

OTHER PUBLICATIONS

Wikipedia, "Hardware-in-the-Loop Simulation", retrieved on Jun. 7, 2018. (Year: 2018).*

(Continued)

*Primary Examiner* — Cedric Johnson
(74) *Attorney, Agent, or Firm* — Cozen O'Connor (57) ABSTRACT

A method for simulation of an automated industrial plant simulated in a plant model divided into a plurality of submodels, where the submodels are modeled with a behavior description comprising a calculation algorithm or a mathematical equation, each submodel is connected into the plant model with at least one submodel, where the plant model or the submodels are translated in preparation for the simulation by a translation run into a form which is executable by a computer system, an execution sequence of the submodels is defined, the submodels are expanded by run time models having a calculation time assigned to a respective submodel, where an overall calculation time of the plant model is derived and graphically presented in the granularity of the calculation times of the submodels based on the execution sequence and the expanded submodels to provide a detection and localization of real-time-critical execution paths in the plant model.

16 Claims, 5 Drawing Sheets

(51) Int. Cl.
  *G06F 17/50*   (2006.01)
  *G05B 19/418*  (2006.01)
(58) Field of Classification Search
  USPC .......................................... 703/2, 17, 19, 13
  See application file for complete search history.

(56) References Cited

OTHER PUBLICATIONS

Siemens AG, Simit SCE, Siemens AG, pp. 1-46, SIMIT-HB-SCE-2009-07; 2009; DE; Jul. 1, 2009.
Guillermo Vigueras et al:"Workload balancing in distributed crowd simulations: the partitioning method"; in: the Journal of Supercomputing; vol. 50; No. 2; pp. 261-269; ISSN 0920-8542; DOI 10.1007/s11227-009-0375-5; XP055121688;; 2009; Dec. 19, 2009.
Wook Hyun Kwon et al.:"Real-Time Distributed Software-In-the-Loop Simulation for Distributed Control Systems"; in: Computer Aided Control System Design, 1999. Proceedings of the 1999 IE EE International Symposium on Kohala Coast, Hi, USA Aug. 22-27, 1999, Piscataway, NJ, USA, IEEE, US; pp. 115-119; ISBN 978-0-7803-5500-2; XP010360421:; 1999; Aug. 22, 1999.
Papazoglou M.P. et al.:"Service-Oriented Computing"; In: Communications or the ACM, Associationn for Computing Machinery, INC, United States; vol. 46; No. 10; pp. 25-28; ISSN 0001-0782; DOI 10.1145/944217.944233; XP002497728;; 2003; Oct. 1, 2003.

\* cited by examiner

METHOD AND SIMULATION ARRANGEMENT FOR SIMULATING AN AUTOMATED INDUSTRIAL PLANT

BACKGROUND OF THE INVENTION

1. Field of the Invention

The invention relates to a method for simulation of an automated industrial plant, where the industrial plant is simulated in a plant model and the plant model is divided into a number of submodels, the submodels are modeled in this case with a behavior description which comprises a calculation algorithm or a mathematical equation, each submodel is connected in accordance with the simulation of the industrial plant into the plant model with at least one other submodel, and where, in preparation for the simulation, the plant model or the submodels are translated by a translation run into a form that is executable by a computer system on which the simulation will be executed, in this case an execution sequence of the submodels is additionally defined.

The invention further relates to a simulation arrangement for simulation of an automated industrial plant, comprising a computer system with simulation software, a library with a plurality of submodels, a component editor for creating a plant model for an industrial plant, where the industrial plant is able to be simulated via a linkage of the submodels to the plant model, and where the submodels have a calculation algorithm or a mathematical equation, with a translator which is configured to place the plant model, via a translation, into a form which is executable by the computer program with the simulation software for the simulation, with a scheduler means, which is configured, in accordance with the linkage of the submodels, to define an execution sequence for the submodels.

In the sense of the invention, real time or real time-capability means that a simulated unit of time (time slice) corresponds in its duration to a scanning time of an automation device. Accordingly, real time operation is understood as the operation of the computer system in which programs for processing data that arises are always ready for operation and indeed are ready such that the processing results are available within a predetermined period of time.

2. Description of the Related Art

Simulation models with real time capabilities are preferably used, for example, in an Operator Training System (OTS) or in systems for virtual commissioning (VIBM) in the process industry environment.

A simulation method and a simulation arrangement are known from the Siemens user manual "SIMIT SCE", issue dated July 2009, SIMIT-HB-SCE-2009-07. In this known simulation model plant, models are created for the simulator and are executed, for example, over a longer period of time. With a simulation of the plant models over a longer period of time, it can happen that run time violations occur, i.e., run times of the models take longer than a predetermined simulation cycle, which in its turn corresponds to a real period of time.

SUMMARY OF THE INVENTION

It is an object of the present invention is to avoid later run time violations during the simulation of a plant model to be simulated.

This and other objects and advantages are achieved in accordance with the invention by the method for simulating an automated industrial plant in which submodels are expanded before a translation run in each case by a run time model, where the run time models have a calculation time assigned to the respective submodel, and where based on the execution sequence and the submodels expanded by the run time models, an overall calculation time of the plant model in the granularity of the calculation times of the submodels is derived and graphically presented, through which a detection and localization of real time-critical execution threads in the plant model is possible. In accordance with the invention, there is provision for an expansion of simulation components, especially of submodels, through run time models. Depending on the complexity of a submodel and the power of a computer, the calculation time for a submodel in a simulated unit of time can fluctuate and thus run time violations can also occur. With the aid of the invention, it is insured before the start of the simulation that the simulation is capable of running in real time or based on the virtual time and that no run time violations occur.

In an advantageous embodiment of the method, the calculation time of the submodels is stored, as a function of at least one parameter which influences the calculation time during the execution of the submodels for a particular situation, in the run time models, where a processor configuration of the computer system is selected as the at least one parameter. A processor configuration refers to a specific adaptation of program and hardware components of a computer system to the given infrastructure as well as the system of its composition. A hardware configuration is understood as a specific composition of the components of a computer system. Thus a hardware configuration consists, for example, of a specific motherboard, a processor type, a specific graphics card and a specific hard disk. In addition, the computer system can also be configured so that, for example, it prints on a specific printer in which a specific printer or device driver is installed.

In order to obtain reliable information about a possible run time violation of the simulation, the translation run for the plant model composed of the submodels is executed in an initialization phase of the computer system and the submodels are mapped in their execution sequence to the durations of the respective calculation times of the submodels in an overlaid presentation, where, in the event of the sum of the calculation times exceeding a period of a simulation cycle time, a warning about real time violation is given.

A real time simulator recalculates the submodels in time slices cycle-by-cycle. As a result, a required simulation cycle time exists as a real time specification. If the processing of the plant model in the simulation takes longer than the required simulation cycle time then a real time violation is present. A challenge in the modeling of a process technology plant is to find a suitable balance between the degree of detail and simulation speed of the submodels. In the event of the processing time of a submodel already lying outside the required simulation cycle time, the method is expanded such that the period of time of the simulation cycle time is recognized as being exceeded and at least one submodel is processed in parallel on a second computer system, so that the required simulation cycle time can be adhered to again.

In a further optimization of the method run time measurements of the submodels are carried out during the simulation, where configuration-dependent run time predictions can be derived from the run time measurements for different computer configurations and a configuration dataset of the computer configuration with the established run time can be stored as a parameter set in the run time models. This enables a computer-dependent run time of the run time models to be successively and adaptively improved for simulation modeling. In such cases, during a simulation of the plant model without run time violations, run time measurements are continuously performed on the submodels and are stored together with the current computer configuration. Preferably "Worth Case" run times, which are primarily of significance for the calculation of the run time model, are stored. If during the simulation the run times were to change so greatly that the danger of a real time violation increases, then the aforementioned method for parallelization of simulation runs on a second computer system is provided again. A redistribution of the calculation sequence would minimize the danger of real time violation. During modeling of a new plant using the already known submodels with their run time models, there can be recourse to the experience of the run time behavior from the past. This means that a plant simulation improves as it evolves with each new use.

It is also an object of the invention to provide a simulation arrangement for simulation of an automated industrial plant, with the submodels again having a run time model, where the run time models have a calculation time assigned to the respective submodel, and where the translator is further configured, based on the execution sequence and the submodels expanded by the run time models, to derive and graphically represent an overall calculation time of the plant model in a granularity of the calculation times of the submodels, through which a detection and localization of real-time-critical execution threads in the plant model is possible.

Advantageously the run time models have an adaptor and the adaptor is configured to dynamically adapt the calculation time of the submodels as a function of at least one parameter which influences the calculation time during the execution of the submodels in line with the situation, where a computer configuration of the computer system is selected as the at least one parameter.

In a further optimized execution of the simulation arrangement, the arrangement possesses a monitor that is equipped to map the submodels in the execution sequence to the periods of time of the respective calculation times of the submodels in an overlaid presentation and is further equipped, in the event of the sum of the calculation times exceeding a period of time of a simulation cycle time, to output a warning of a real time violation.

For a parallelization of a simulation, i.e., to process the submodels on different simulators (computers), the simulation arrangement is equipped with an interface to a second computer system with second simulation software and is also equipped to transfer a submodel to the second computer system for parallel processing.

A further improved simulation arrangement is equipped with a measurement device for measuring the run time of a submodel during a simulation. The simulation arrangement is further equipped to store the measurement results for a currently valid computer configuration together with a configuration dataset of the computer configuration of the computer system as a parameter set in the run time models.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

For further explanation of the method and of the simulation arrangement, the drawing shows an exemplary embodiment, in which.

DETAILED DESCRIPTION OF THE PRESENTLY EXEMPLARY EMBODIMENTS

Figure 1:
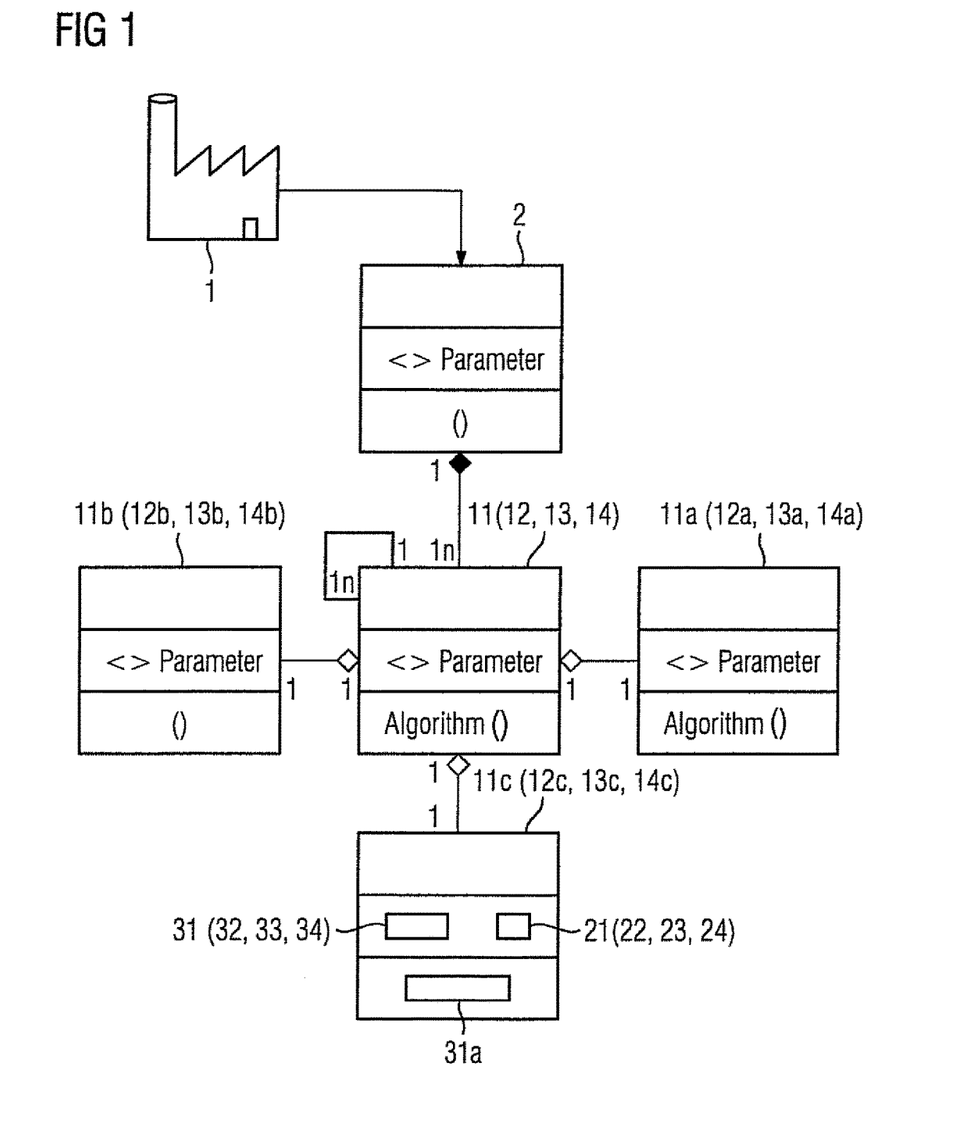
FIG. 1 shows a submodel expanded by a run time model in a plant model in accordance with the invention.

In accordance with FIG. 1, a plant model 2 simulates an industrial plant 1. The plant model 2 comprises a number of submodels 11, 12, 13, 14, where, for purposes of modeling and clarity, only the submodel 11 is shown in this diagram. The plant model 2 is always assigned at least one submodel 11. A connecting line between the plant model 2 and the submodel 11 shows an initialization 1, . . . , n, which means that the plant model 2 can comprise n submodels. In the present example, the plant model 2 comprises four submodels. Each submodel is assigned a behavior description 11a, 12a, 13a, 14a. For a subsequent visualization of the plant model 2, each submodel 11, 12, 13, 14 is assigned a visualization configuration 11b, 12b, 13b, 14b. For better detection and localization of real-time-critical paths in a plant model, each submodel 11, 12, 13, 14 is assigned a run time model 11c, 12c, 13c, 14c. Accordingly the plant model 2 is divided into a number of submodels 11, 12, 13, 14, where the submodels 11, 12, 13, 14 are modulated with a behavior description 11a, 12a, 13a, 14a. The behavior descriptions are preferably present in the form of calculation algorithms or mathematical equations. The run time models 11c, 12c, 13c, 14c have a calculation time 21, 22, 23, 24 assigned to the respective submodel 11, 12, 13, 14. In a translation run for a later simulation, the model structure of the plant model 2 comprising the submodels 11, 12, 13, 14 is checked in an initialization phase of the computer system, where the submodels are mapped in their execution sequence to the durations of the respective calculation times 21, 22, 23, 24 of the submodels 11, 12, 1, 13, 14 in an overlaid presentation.

With the overlaid presentation, an overall calculation time 20 of the plant model 2 in the granularity of the calculation times 21, 22, 23, 24 is now recognizable, through which a detection and localization of real-time-critical execution paths in the plant model 2 becomes possible.

The calculation time 21, 22, 23, 24 of the submodels 11, 12, 13, 14 can thus be influenced for a particular situation, a parameter set 31, 32, 33, 34 is stored in the run time models 11c, 12c, 13c, 14c for this purpose.

Figure 2:
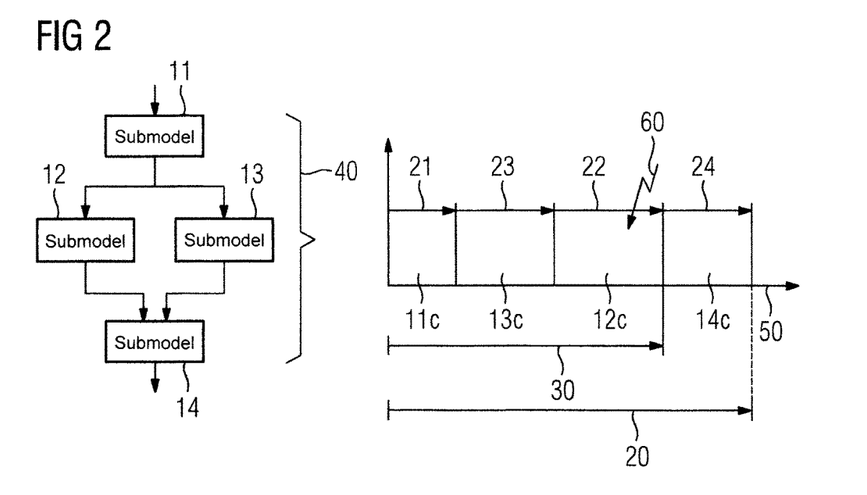
FIG. 2 shows a plant model and the presentation of the part run times in accordance with the invention.

In accordance with FIG. 2, starting from the plant model 2, a translation run and a subsequent presentation of the run times of the submodels 11, 12, 13, 14 in accordance with the prior art is shown. In an initialization of the simulation, such as with a prior-art plant simulator "SIMIT", a translation run 40 is started by the initialization of the simulation. Here the plant model 2 is translated into an executable run time model and optimizations are undertaken. Through the translation run 40 the plant model 2 is translated into a form that is executable by a computer system 101 on which the simulation will be executed. In this process, an execution sequence of the submodels 11, 12, 13, 14 is additionally defined.

The run time models 11c, 12c, 13c, 14c are shown above a time axis 50 with their individual calculation times 21, 22, 23, 24. On the time axis 50, the first run time model 11c takes up a first calculation time 21, the third run time model 13c takes up a third calculation time 23, the second run time model 12c takes up a second calculation time 22 and the fourth run time model 14c takes up a fourth calculation time 24.

From the sum of the calculation times 21, 22, 23, 24 an overall calculation time 20 is produced.

In order to obtain a real-time-capable simulation, the run time models with their calculation times must, however, lie within a simulation cycle time 30. A run time violation arises if the calculation times 21, 22, 23, 24 exceed a simulation cycle time 30, which is shown by a run time violation indicator 60.

Figure 3:
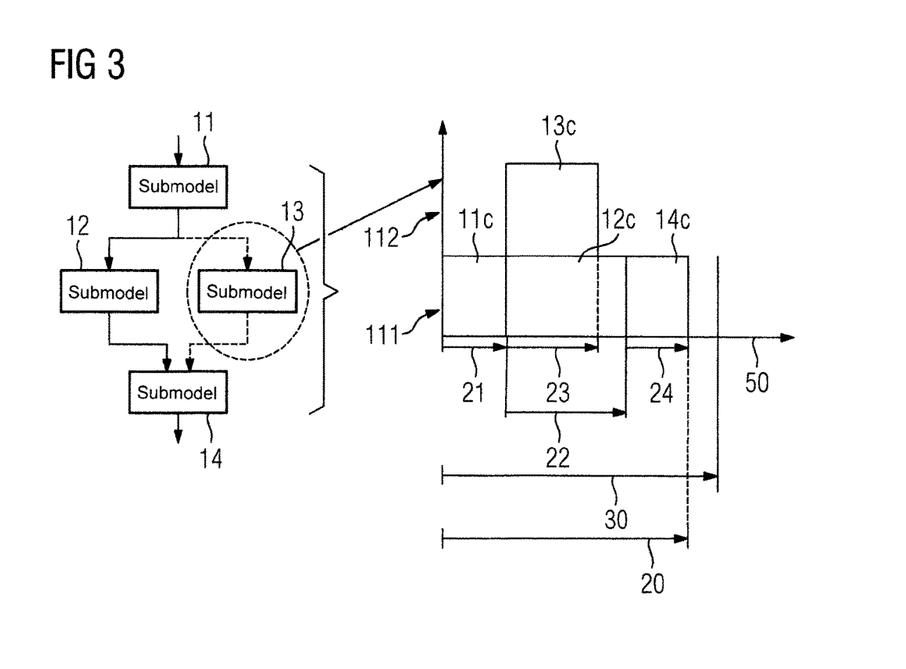
FIG. 3 shows the plant model from FIG. 2 and a presentation of the part run times during parallel processing in accordance with the invention.

In accordance with FIG. 3, an option is shown in which a new overall calculation time 20 lies within the required simulation cycle time 30. By contrast, in accordance with FIG. 2, the calculation of the submodel 12 has only been undertaken partly in the required simulation time, for example, and with the submodel 14 the calculation has not yet begun. That is the plant model 2 can, for example, not be used for an HIL test with real controllers or for an Operator Training System. In the present invention, knowledge about whether a run time violation is present is obtained before the actual simulation. According to the previous prior art, such real time violations or run time violations will not result in problems until during a simulation and can only be detected then. A worst case run time of a plant model 2 or of a simulation model is dependent on the input values. As a result, a real time violation can occur not only at the beginning of the simulation but also at any other given point in time. Very long simulations are often performed for extensive tests or for training. Consequently, it is of central importance to detect real time violations before the actual simulation, e.g., as described here during the initialization shortly after the translation run and possibly be able to rectify them. If a real time violation has been detected, measures to counter it can be taken. There are two options for doing this:

1. Simplify the submodels, i.e., reduce the calculation time of the submodel by a higher level of abstraction, or
2. Parallelize the simulation, i.e., process the submodels on different simulators.

The second option is shown by FIG. 3. The first submodel 11, the second submodel 12 and the fourth submodel 14, or in the simulation their run time models 11c, 12c, 14c, are processed in a first execution level 111 in parallel to a second execution level 112 for the third submodel 13 or the third run time model 13c. The first run time level 111 is operated by a first computer system 101 with first simulation software 101a, the second run time level 112 is operated in parallel via a second computer system 102 with second simulation software 102a.

Accordingly, the third submodel 13 is processed in parallel on another computer, because this is permitted by the execution sequence of the plant model 2. The overall calculation time 20 now lies below the required simulation cycle time 30 and is thus real-time-capable, where the simulation is permitted and can be started.

Figure 4:
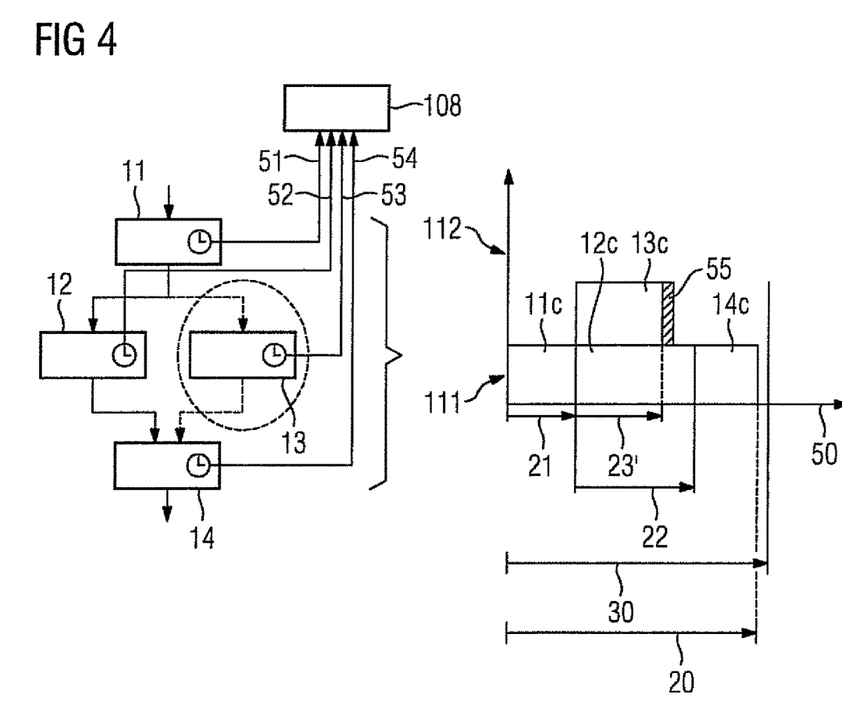
FIG. 4 shows the plant model with the submodels expanded by run time models and the presentation of the part run times while adhering to the required simulation cycle time; in accordance with the invention.

FIG. 4 shows a simulation run or a translation run and a simulation of the run time models 11c, 12c, 13c, 14c with their calculation times in an optimized simulation model in accordance with the invention. The first run time model 11c is equipped in accordance with FIG. 1, with a first parameter set 31 and a first adaptor means 31a, where the adaptor 31a includes programming functions, such as "Get Run time" or "Measure Run time". The fact that the run time models have the expansions enables a time measurement to be applied via a measurement device 108, which is a component of the simulation arrangement 100 in accordance with FIG. 5, to the submodels 11, 12, 13, 14 or to the run time models 11c, 12c, 13c, 14c. In order to prevent the problem of a real time violation during a simulation, run time measurements 51, 52, 53, 54 are performed on the submodels 11, 12, 13, 14 during a simulation. From the run time measurements 51, 52, 53, 54, configuration-dependent run time predictions can be derived from different computer configurations and a configuration dataset of the computer configuration with the established run times as parameter set 31, 32, 33, 34 can be stored in the run time models 11c, 12c, 13c, 14c.

If the run times or the calculation times 21, 22, 23, 24 were now to change so greatly during the simulation that the danger of a real time violation increases, the method already mentioned in FIG. 3 of parallelization could be undertaken. A redistribution of the calculation sequence would minimize the danger of the real time violation. These methods of redistribution of the calculation sequence during the simulation bring a decisive advantage for preventing a real time violation. In the modeling of a new plant using the known submodels 11, 12, 13, 14, there can be recourse to the experience of the run time behavior from the past. Thus, the plant simulation improves as it evolves with each new use.

Each of the submodels 11, 12, 13, 14 with its associated run time models 11c, 12c, 13c, 14c now has mechanisms, such as Get Run time or Measure Run time, for example, which is indicated by a clock symbol in the submodels 11, 12, 13, 14. In run time model 13c, a run time fluctuation 55 is indicated by a crosshatched area. This run time fluctuation 55 can occur during a simulation as a result of variations in utilization of the computer. With the run time fluctuation 55 a new third calculation time 23' is produced for the third run time model 13c, which in this case is fortunately smaller than the original calculation time 23. This run time fluctuation, however, can only be established if during the simulation run time measurements are made with the measurement device 108 on the submodels 11, 12, 13, 14.

Figure 5:
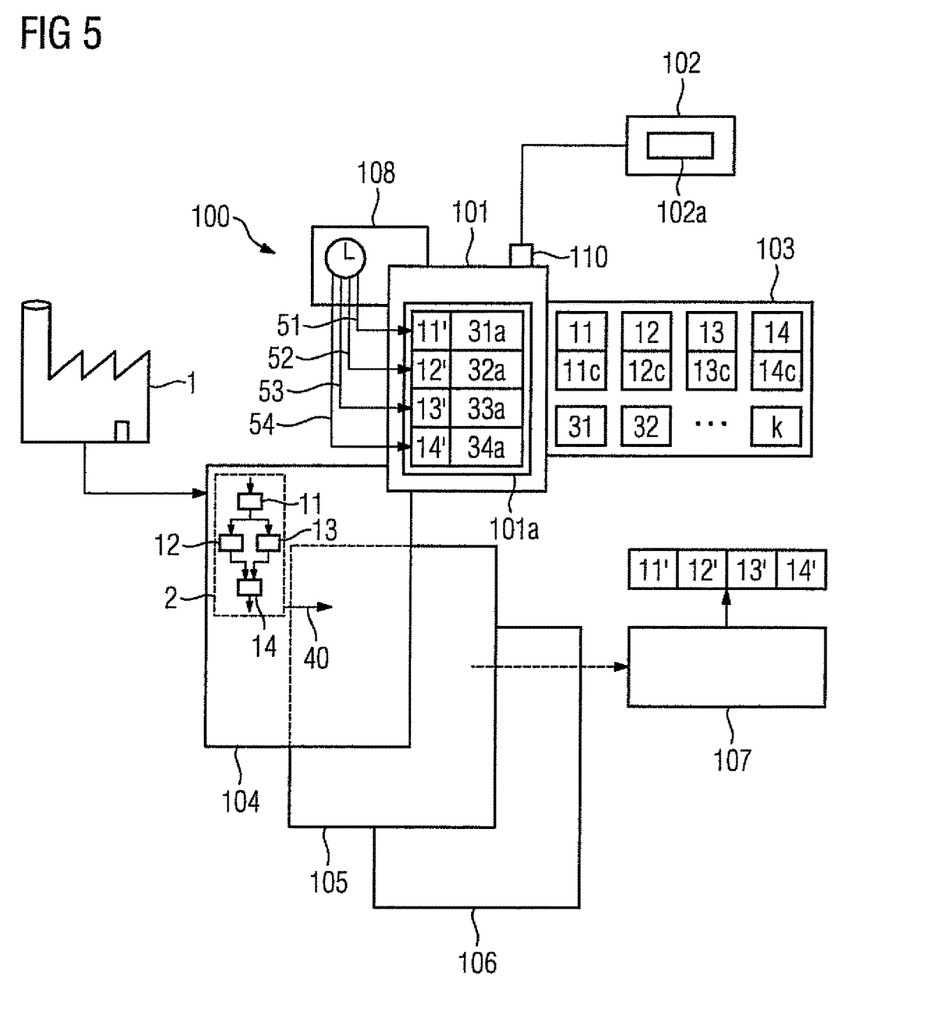
FIG. 5 shows a simulation arrangement for simulation of an automated industrial plant.

FIG. 5 shows a simulation arrangement 100 for simulation of an automated industrial plant 1. The simulation arrangement 100 comprises a first computer system 101 with first simulation software 101a. For an optional parallel simulation the simulation arrangement 100 further comprises a second computer system 102 with second simulation software 102a. The second computer system 102 can be supplied with possible simulation data or models via an interface 110 of the first computer system 101. Furthermore, the first computer system 101 has a library 103. The submodels 11, 12, 13, 14 with their run time models 11c, 12c, 13c, 14c are stored in the library 103. To create a plant model 2, a component editor 104 is available, where the industrial plant 1 is simulated in the component editor 104 by linking the submodels 11, 12, 13, 14 to the plant model 2.

The plant model 2 is supplied via a translation run application 42 to a translator 105. The translator 105 is equipped to place the plant model 2 via a translation into a form which is executable by the first computer system 101 with the first simulation software 101a for the simulation.

A scheduler means 106, which is equipped in accordance with the linkage of the submodels 11, 12, 13, 14 to define an execution sequence for the submodels 11, 12, 13, 14, follows on from the translator 105.

The translator 105 and the scheduler 106 are coupled for data communication and are connected to a monitor 107. The monitor 107 ensures that the run time models 11c, 12c, 13c, 14c are simulated in the granularity of the calculation times of the submodels 11, 12, 13, 14 and presented graphically, where the monitor 107 is also configured to detect and localize a real time violation.

Figure 6:
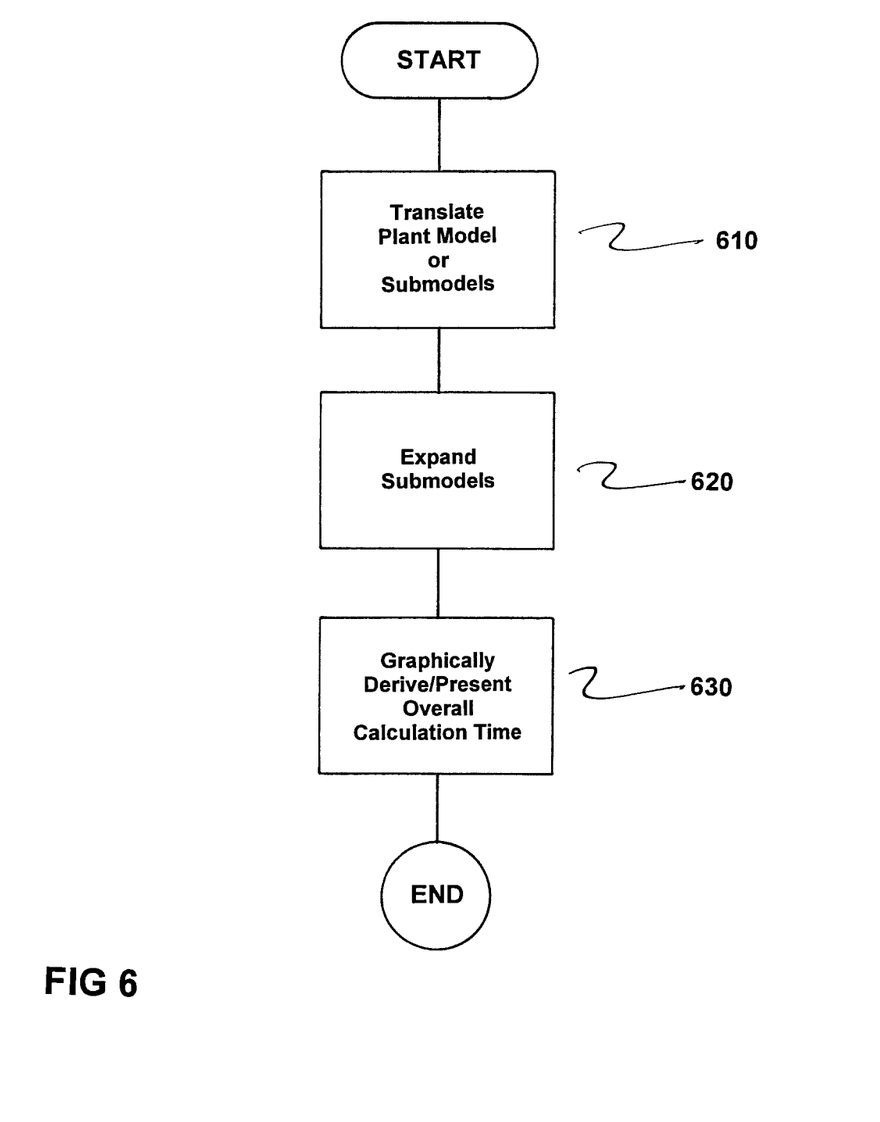
FIG. 6 is a flowchart of the method in accordance with the invention.

The measuring device 108 for measuring the run times of each submodel 11, 12, 13, 14 during a simulation is further configured to store the measurement results for a currently valid computer configuration together with a configuration dataset of the computer configuration of the first computer system 101 as a parameter set 31, 32, 33, 34. Each submodel 11, 12, 13, 14 has an adaptor 31a, 32a, 33a, 34a. As a result, adapted submodels 11', 12', 13', 14' can arise during the simulation which have been improved for later simulations with respect to their run time behavior depending on a computer configuration. FIG. 6 is a flowchart of a method for simulating an automated industrial plant (1) simulated in a plant model (2) which is divided into a plurality of submodels (11, 12, 13, 14) modeled with a behavior description (11a, 12a, 13a, 14a) which comprises a calculation algorithm or a mathematical equation, where each submodel of the plurality of submodels (11, 12, 13, 14) is connected in accordance with the simulation of the automated industrial plant (1) into the plant model (2) with at least one submodel of the plurality of submodels (11, 12, 13, 14).

The method comprises translating, by a translation run, in preparation for the simulation one of (i) the plant model (2) and (ii) the plurality of submodels (11, 12, 13, 14) into a form which is executable by a computer system (101) upon which the simulation is executed, as indicated in step 610. Here, an execution sequence of the plurality of submodels (11, 12, 13, 14) is additionally defined.

Next, each submodel of the plurality of submodels (11, 12, 13, 14) is expanded by a run time model (11c, 12c, 13c, 14c) before the translation run, as indicated in step 620. Here, the run time models (11c, 12c, 13c, 14c) have a calculation time (21, 22, 23, 24) assigned to the respective submodel (11, 12, 13, 14).

Next, an overall calculation time (20) of the plant model (2) in the granularity of the calculation times of the submodels (11, 12, 13, 14) is graphically derived and presented based on the execution sequence and the submodel (11, 12, 13, 14) expanded by the run time models (11c, 12c, 13c, 14c) to provide a detection and localization of real-time-critical execution paths in the plant model (2), as indicated in step 630.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for simulation of an automated industrial plant simulated in a plant model which is divided into a plurality of submodels modeled with a behavior description which comprises a calculation algorithm or a mathematical equation, each submodel of the plurality of submodels being connected in accordance with the simulation of the automated industrial plant into the plant model with at least one submodel of the plurality of submodels, the method comprising:

translating, by a translation run, in preparation for the simulation one of (i) the plant model and (ii) the plurality of submodels into a form which is executable by a computer system upon which the simulation is executed, an execution sequence of the plurality of submodels being additionally defined;

expanding, by a run time model, each submodel of the plurality of submodels before the translation run, the run time models having a calculation time assigned to the respective submodel, and each submodel being assigned a visualization configuration; and deriving and graphically presenting an overall calculation time of the plant model in the granularity of the calculation times of the submodels based on the execution sequence and the submodel expanded by the run time models to provide a detection and localization of real-time-critical execution paths in the plant model to ensure, prior to start of the simulation of the automated industrial plant simulated in the plant model, the simulation is executable such that operation of the computer system in which programs for processing data that arises are always ready for operation and such that processing results are available within a predetermined period of time to ensure run time violations are eliminated from the simulation to improve efficiency of the automated industrial plant modeled based on the improved simulation of the automated industrial plant.

2. The method as claimed in claim 1, wherein the calculation time of the submodel is stored in the run time models as a function of at least one parameter which influences the calculation time during the execution of the plurality of submodels in accordance with a specific situation, wherein a computer configuration of the computer system is selected as the at least one parameter.

3. The method as claimed in claim 2, wherein the translation run for the plant model comprising the plurality of submodels is performed in an initialization phase of the computer system and the plurality of submodels are mapped in their execution sequence to durations of respective calculation times of the plurality of submodels in an overlaid presentation; and wherein, in an event of a sum of the calculation times exceeding a duration of a simulation cycle time, a warning of a real time violation is issued.

4. The method as claimed in claim 3, wherein run time measurements are performed on each of the plurality of submodels during the simulation, wherein configuration-dependent run time predictions for different computer configurations are derived from the run time measurements and a configuration dataset of a computer configuration with an established run time is stored as a parameter set in the run time models.

5. The method as claimed in claim 2, wherein run time measurements are performed on each of the plurality of submodels during the simulation, wherein configuration-dependent run time predictions for different computer configurations are derived from the run time measurements and a configuration dataset of a computer configuration with an established run time is stored as a parameter set in the run time models.

6. The method as claimed in claim 1, wherein the translation run for the plant model comprising the plurality of submodels is performed in an initialization phase of the computer system and the plurality of submodels are mapped in their execution sequence to durations of respective calculation times of the plurality of submodels in an overlaid presentation; and
wherein, in an event of a sum of the calculation times exceeding a duration of a simulation cycle time, a warning of a real violation is issued.

7. The method as claimed in claim 6, wherein, in the event of the duration of the simulation cycle time being exceeded, at least one submodel of the plurality of submodels is executed in parallel on a second computer system.

8. The method as claimed in claim 6, wherein run time measurements are performed on each of the plurality of submodels during the simulation, wherein configuration-dependent run time predictions for different computer configurations are derived from the run time measurements and a configuration dataset of a computer configuration with an established run time is stored as a parameter set in the run time models.

9. A system for simulation of an automated industrial plant, comprising:
a computer system including:
a processor;
memory;
simulation software stored in the memory and executable by the processor,
a library having a plurality of submodels,
a component editor for creating a plant model for an industrial plant which is simulated by linking the plurality of submodels to the plant model, the plurality of submodels having a calculation algorithm or a mathematical equation,
a translator configured via a translation to place the plant model into a form which is executable by the computer system with the simulation software for the simulation, and
a scheduler configured, in accordance with the linkage of the plurality of submodels, to define an execution sequence for the plurality of submodels;
wherein each of the plurality of submodels further includes a run time model, each of the plurality of submodel being assigned a visualization configuration, and each respective run time model including a calculation time assigned to a respective submodel of the plurality of submodules;
wherein the translator is further configured, based on the execution sequence and the plurality of submodels expanded by the run time models, to derive and graphically present an overall calculation time of the plant model in a granularity of the calculation times of the plurality of submodels so as to provide a detection and localization of real-time-critical execution paths in the plant model to ensure, prior to start of the simulation of the automated industrial plant, the simulation is executable such that operation of the computer system in which programs for processing data that arises are always ready for operation and such that processing results are available within a predetermined period of time and to ensure run time violations are eliminated from the simulation to improve efficiency of the automated industrial plant modeled based on the improved simulation of the automated industrial plant.

10. The simulation arrangement as claimed in claim 9, wherein the run time models include an adaptation means configured to dynamically adapt the calculation time of the plurality of submodels as a function of at least one parameter which influences the calculation time during the execution of the plurality of submodels in accordance with a specific situation, wherein a computer configuration of the computer system is selected as the at least one parameter.

11. The simulation arrangement as claimed in claim 10, further comprising:
a monitoring device configured to map the plurality of submodels in their execution sequence to durations of respective calculation times of the plurality of submodels in an overlaid presentation, the monitoring device being further configured to issue a warning of a real time violation in an event of the sum of the calculation times exceeding a duration of a simulation cycle time.

12. The simulation arrangement as claimed claim 10, further comprising:
an interface to a second computer system with second simulation software configured to transfer a submodel of the plurality of submodules to the second computer system for parallel processing.

13. The simulation arrangement as claimed in claim 9, further comprising:
a monitoring device configured to map the plurality of submodels in their execution sequence to durations of respective calculation times of the plurality of submodels in an overlaid presentation, the monitoring device being further configured to issue a warning of a real time violation in an event of the sum of the calculation times exceeding a duration of a simulation cycle time.

14. The simulation arrangement as claimed claim 13, further comprising:
an interface to a second computer system with second simulation software configured to transfer a submodel of the plurality of submodules to the second computer system for parallel processing.

15. The simulation arrangement as claimed claim 9, further comprising:
an interface to a second computer system with second simulation software configured to transfer a submodel of the plurality of submodules to the second computer system for parallel processing.

16. The simulation arrangement as claimed in claim 9, further comprising:
a measurement device for measuring the run time of a submodel during a simulation and for storing the measurement results for a currently valid computer configuration together with a computer dataset of the computer configuration of the computer system as a parameter set in the run time models.

* * * * *